US011240950B2

(12) United States Patent
Komaike (10) Patent No.: US 11,240,950 B2
(45) Date of Patent: Feb. 1, 2022

(54) COMPONENT MOUNTING APPARATUS

(71) Applicant: YAMAHA HATSUDOKI KABUSHIKI KAISHA, Iwata (JP)

(72) Inventor: Kunimune Komaike, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 209 days.

(21) Appl. No.: 16/494,243

(22) PCT Filed: Mar. 22, 2017

(86) PCT No.: PCT/JP2017/011380
§ 371 (c)(1),
(2) Date: Sep. 13, 2019

(87) PCT Pub. No.: WO2018/173137
PCT Pub. Date: Sep. 27, 2018

(65) Prior Publication Data
US 2020/0137935 A1   Apr. 30, 2020

(51) Int. Cl.
*H05K 13/08* (2006.01)
*H05K 13/02* (2006.01)
*H05K 13/04* (2006.01)

(52) U.S. Cl.
CPC ......... *H05K 13/0812* (2018.08); *H05K 13/02* (2013.01); *H05K 13/0409* (2018.08)

(58) Field of Classification Search
CPC . H05K 13/02; H05K 13/0409; H05K 13/0812
See application file for complete search history.

(56) References Cited

U.S. PATENT DOCUMENTS

| 6,317,972 | B1 * | 11/2001 | Asai | H05K 13/0812 29/833 |
| 7,559,134 | B2 * | 7/2009 | Gaida | H05K 13/0815 29/720 |
| 8,181,337 | B2 * | 5/2012 | Watanabe | H05K 13/0215 29/832 |
| 8,595,918 | B2 * | 12/2013 | Jindo | H04N 5/2355 29/709 |
| 10,674,650 | B2 * | 6/2020 | Takama | H05K 13/0452 |
| 10,842,060 | B2 * | 11/2020 | Takama | H05K 13/0815 |

(Continued)

FOREIGN PATENT DOCUMENTS

| CN | 106233832 A | 12/2016 |
| JP | 2003-133791 A | 5/2003 |

(Continued)

OTHER PUBLICATIONS

International Search Report issued in PCT/JP2017/011380; dated Jun. 27, 2017.

(Continued)

*Primary Examiner* — Carl J Arbes
(74) *Attorney, Agent, or Firm* — Studebaker & Brackett PC (57) ABSTRACT

The image including both of the component and the nozzle that is being lowered toward the component is captured. The target height at which the nozzle is stopped in the mounting process is controlled based on this image. This enables the target height at the time of lowering the nozzle toward the component to be controlled regardless of a flow rate of air sucked from the nozzle.

19 Claims, 8 Drawing Sheets

(56) References Cited

U.S. PATENT DOCUMENTS

| | | | | |
|---|---|---|---|---|
| 2004/0163243 A1* | 8/2004 | Noda | ................ | H05K 13/081 29/834 |
| 2005/0123187 A1* | 6/2005 | Bushman | .......... | H05K 13/0812 382/141 |
| 2006/0075631 A1* | 4/2006 | Case | ................ | H05K 13/0812 29/709 |

FOREIGN PATENT DOCUMENTS

| | | | |
|---|---|---|---|
| JP | 2003-133796 A | | 5/2003 |
| JP | 2015-090925 A | * | 5/2015 |

OTHER PUBLICATIONS

An Office Action issued by China National Intellectual Property Administration dated May 25, 2020, which corresponds to Chinese Patent Application No. 201780088297.3 and is related to U.S. Appl. No. 16/494,243 with English language translation.

* cited by examiner

COMPONENT MOUNTING APPARATUS

CROSS-REFERENCE TO RELATED APPLICATION

This application is a National Stage of International Patent Application No. PCT/JP2017/011380, filed Mar. 22, 2017, the entire contents of which is incorporated herein by reference.

BACKGROUND

Technical Field

This disclosure relates to a component mounting technique for mounting a component sucked by a nozzle on a board.

Background Art

Component mounting apparatus described in JP2003-133796 and JP2003-133791 suck a component by a nozzle by lowering the nozzle toward the component and causing the nozzle to suck as the nozzle is stopped at a target height. At this time, to firmly suck the component, it is required to set the target height such that the nozzle contacts the component at the target height. Accordingly, in JP2003-133796, the target height is set based on a detection result of a flow rate of air sucked from the nozzle.

SUMMARY

However, in the above method, it may not be possible to accurately set the target height, for example, if the flow rate changes due to dust or the like adhering to the nozzle. Accordingly, a technique capable of controlling the target height of the nozzle regardless of the flow rate of air sucked from the nozzle has been required.

This disclosure was developed in view of the above problem and aims to provide a technique capable of controlling a target height at the time of lowering a nozzle toward a component regardless of a flow rate of air sucked from the nozzle.

A component mounting apparatus according to the disclosure, comprises a board holding unit configured to hold a board; a component supply unit configured to supply components stored in storage recesses; a mounting head that performs a mounting process of mounting the component on the board after stopping a nozzle being lowered toward the component at a target height and sucking the component by the nozzle in contact with the component at the target height; an image capturing unit configured to capture an image including both of the component or the storage recess and the nozzle being lowered toward the component; and a control unit configured to control the target height, at which the nozzle is stopped in the mounting process, based on the image captured by the image capturing unit.

A nozzle height control method according to the disclosure, comprises capturing an image including both of a component or a storage recess storing the component and a nozzle being lowered toward the component; and performing a mounting process of mounting the component on a board after stopping the nozzle lowered toward the component at a target height and sucking the component by the nozzle in contact with the component at the target height; wherein the target height at which the nozzle is stopped in the mounting process, is controlled based on the image.

In the disclosure (component mounting apparatus, nozzle height control method) thus configured, the image is captured which includes both of the component or the storage recess storing the component and the nozzle being lowered toward the component. Then, the target height at which the nozzle is stopped in the mounting process is controlled based on this image. In this way, the target height at the time of lowering the nozzle toward the component can be controlled regardless of a flow rate of air sucked from the nozzle.

The component mounting apparatus may be configured so that the control unit controls the target height, at which the nozzle being lowered is stopped, based on the image captured by the image capturing unit while the nozzle is being lowered toward the component in the mounting process. In such a configuration, the target height of the nozzle can be properly controlled in relation to a thickness of the component, for example, even if the thickness of the component varies due to an individual difference.

The component mounting apparatus may be configured so that the control unit controls the target height, at which the nozzle is stopped in the mounting process, based on edges on the image capturing unit side of a lower end part of the nozzle and an upper end part of the component included in the image. In such a configuration, the target height of the nozzle can be properly controlled based on the edges relatively easily distinguishable in an image processing.

The component mounting apparatus may be configured so that the control unit performs a pre-process of causing the image capturing unit to capture the image while lowering the nozzle toward the component and obtaining a height of the nozzle when the contact of the nozzle and the component is confirmed based on the image as the target height, and stops the nozzle being lowered in the mounting process at the target height obtained in the pre-process. In such a configuration, a height of the nozzle when the nozzle and the component are brought into contact with each other is obtained as the target height of the nozzle in the pre-process before the mounting process. Thus, a lowering movement of the nozzle can be stopped at a proper target height in the subsequent mounting process.

The component mounting apparatus may be configured so that the control unit confirms the contact of the nozzle and the component based on positions of edges on the image capturing unit side of a lower end part of the nozzle and an upper end part of the component included in the image. In such a configuration, the contact of the nozzle and the component can be precisely discriminated based on the edges relatively easily distinguishable in the image processing.

The component mounting apparatus may be configured so that the control unit causes the image capturing unit to capture the image a plurality of number of times while lowering the nozzle toward the component, and judges the contact of the nozzle and the component if the image in which the positions of the edges on the image capturing unit side of the lower end part of the nozzle and the upper end part of the component satisfy a predetermined relationship is captured in the pre-process. In such a configuration, whether or not the nozzle has contacted the component can be precisely discriminated based on a plurality of images.

The component mounting apparatus may further comprises a display unit that displays the image captured in the pre-process. In such a configuration, an operator can confirm, for example, a cause of a suction failure of the component by the nozzle by seeing the image displayed on the display unit.

The component mounting apparatus may be configured so that the image capturing unit is attached to the mounting head and captures the image in a direction oblique to a vertical direction. The image including the images of both the component or the storage recess storing the component and the nozzle being lowered toward the component can be precisely captured by such an image capturing unit.

According to the disclosure, the target height at the time of lowering the nozzle toward the component can be controlled regardless of the flow rate of air sucked from the nozzle.

DETAILED DESCRIPTION

Figure 1:
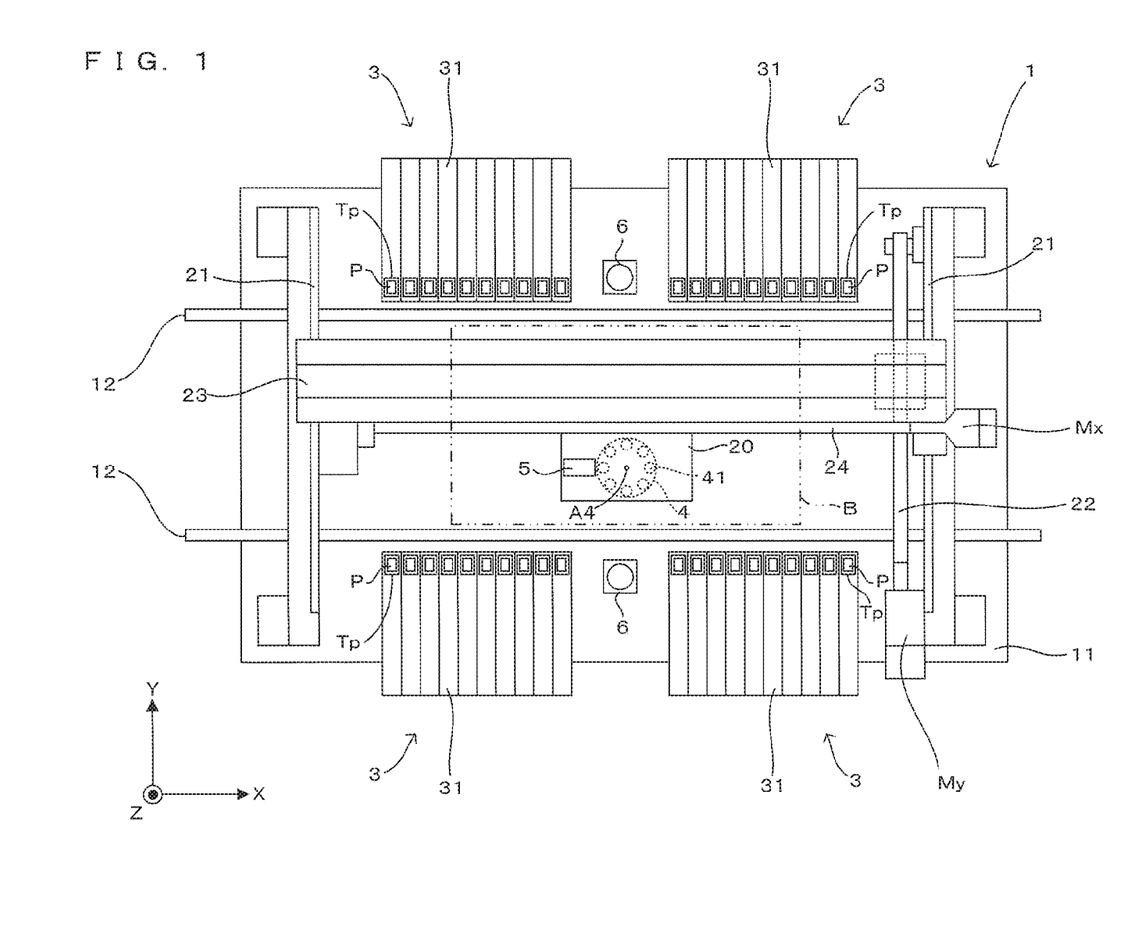
FIG. 1 is a partial plan view schematically showing a component mounting apparatus according to the disclosure.
Figure 2:
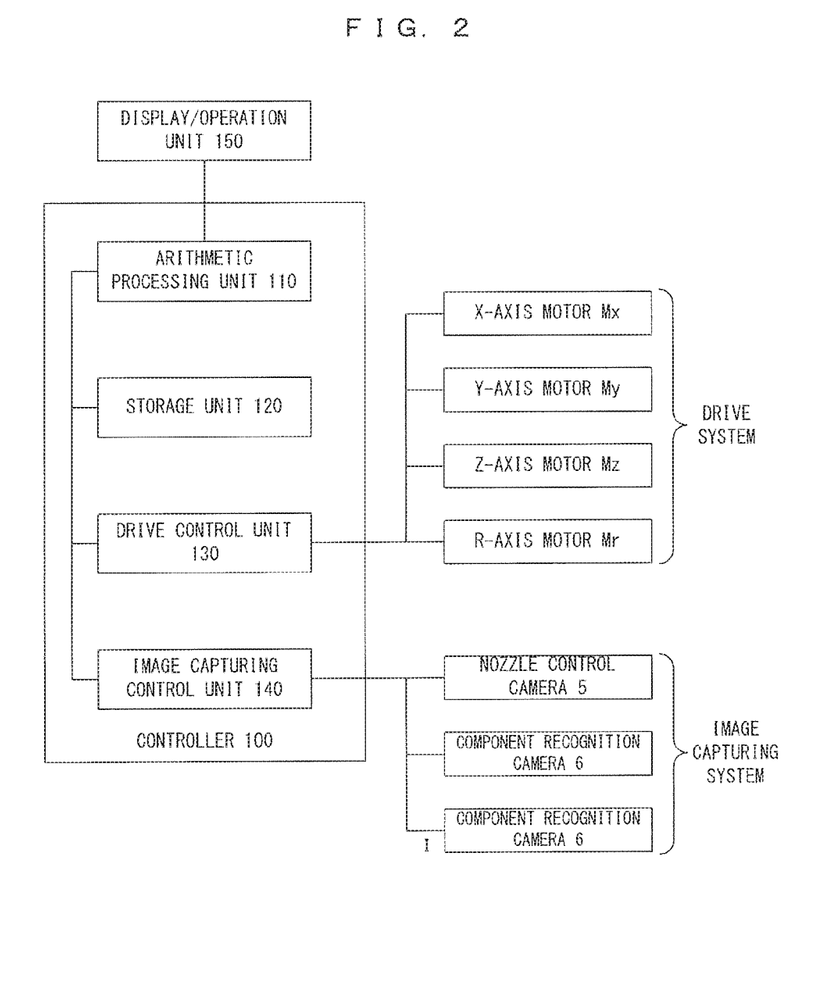
FIG. 2 is a block diagram showing an electrical configuration of the component mounting apparatus of FIG. 1.

FIG. 1 is a partial plan view schematically showing a component mounting apparatus according to the disclosure. FIG. 2 is a block diagram showing an electrical configuration of the component mounting apparatus of FIG. 1. In FIG. 1 and subsequent figures, an XYZ orthogonal coordinate system with a Z direction representing a vertical direction is shown as appropriate. As shown in FIG. 2, the component mounting apparatus 1 includes a controller 100 for totally controlling the entire machine. The controller 100 is a computer including an arithmetic processing unit 110 as a processor constituted by a CPU (Central Processing Unit) and a RAM (Random Access Memory), and a storage unit 120 constituted by a HDD (Hard Disk Drive).

The controller 100 includes a drive control unit 130 configured to control a drive system of the component mounting apparatus 1 and an image capturing control unit 140 configured to control an image capturing system of the component mounting apparatus 1. The arithmetic processing unit 110 performs component mounting in a predetermined procedure by controlling the drive control unit 130 and the image capturing control unit 140. Further, the component mounting apparatus 1 is provided with a display/operation unit 150, and the arithmetic processing unit 110 displays a status of the component mounting apparatus 1 on the display/operation unit 150 and receives an instruction from an operator input to the display/operation unit 150.

As shown in FIG. 1, the component mounting apparatus 1 includes a pair of conveyors 12, 12 provided on a base 11. The component mounting apparatus 1 mounts components P on a board B carried to a mounting position (position of the board B in FIG. 1) from an upstream side in an X direction (board conveying direction) by the conveyors 12 and carries the board B completed with component mounting to a downstream side in the X direction from the mounting position by the conveyors 12.

The component mounting apparatus 1 is provided with a pair of Y-axis rails 21, 21 extending in a Y direction, a Y-axis ball screw 22 extending in the Y direction and a Y-axis motor My (servo motor) that rotates and drives the Y-axis ball screw 22, and an X-axis rail 23 is fixed to a nut of the Y-axis ball screw 222 while being supported movably in the Y direction by the pair of Y-axis rails 21, 21. An X-axis ball screw 24 extending in the X direction and an X-axis motor Mx (servo motor) that rotates and drives the X-axis ball screw 24 are mounted on the X-axis rail 23, and a head unit 20 is fixed to a nut of the X-axis ball screw 24 while being supported movably in the X direction by the X-axis rail 23. Accordingly, the drive control unit 130 can move the head unit 20 in the Y direction by rotating the Y-axis ball screw 22 by the Y-axis motor My or move the head unit 20 in the X direction by rotating the X-axis ball screw 24 by the X-axis motor Mx.

Two component supply units 3 are arranged in the X direction on each of both sides of the pair of conveyors 12, 12 in the Y direction. A plurality of tape feeders 31 are detachably mounted side by side in the X direction in each component supply unit 3. The tape feeders 31 extend in the Y direction and supply the components P in the form of small pieces such as integrated circuits, transistors and capacitors to tip parts on the side of the head unit 20 in the Y direction. That is, a tape storing the components P in each of a plurality of pockets Tp aligned at predetermined intervals is loaded in each tape feeder 31, and each tape feeder 31 intermittently feeds the tape in the Y direction toward the head unit 20. In this way, the components P in the tape are fed in the Y direction and successively supplied to the tip part (position of the pocket Tp in FIG. 1) of each tape feeder.

The head unit 20 includes a mounting head 4 of a so-called rotary type. That is, a plurality of (eight) nozzles 41 aligned at equal angular intervals in a circumferential direction about an axis of rotation A4 are detachably mounted on the mounting head 4. The plurality of nozzles 41 are rotatable about the axis of rotation A4 upon receiving a drive force of an R-axis motor Mr (servo motor). The mounting head 4 raises and lowers the nozzle 41 by a drive force of the Z-axis motor MZ (servo motor) to suck and mount the component P. Note that the drive control unit 130 raises and lowers the nozzles 41 while confirming the height of the nozzles 41 based on an output of an encoder of the Z-axis motor Mz. Further, a nozzle control camera 5 is attached to the head unit 20, and the height of the component P in sucking the component P is controlled based on an image I captured by the nozzle control camera 5.

Specifically, the head unit 20 causes the component P that is supposed to be sucked to be within a field of view of the nozzle control camera 5 and causes one nozzle 41 to face the component P from above by rotating the plurality of nozzles 41. Then the mounting head 4 lowers the nozzle 41 to bring the lower end surface of the nozzle 41 into contact with the upper surface of the component P. At this time, the image capturing control unit 140 captures an image I including both of the component P and the nozzle 41 by the nozzle control camera 5, and the arithmetic processing unit 110 adjusts a lowering movement of the nozzle 41 by controlling the drive control unit 130 based on this image I. In this way, the nozzle 41 can be precisely brought into contact with the component P. Subsequently, the mounting head 4 raises the nozzle 41 while sucking the component P by the nozzle 41, thereby holding (picking up) the mounting head 4. By repeating such an operation, a plurality of components P can be held on the mounting head 4.

Further, the component mounting apparatus 1 includes upward facing component recognition cameras 6 mounted on the base 1 between two component supply units 3 arranged in the X direction. The component recognition camera 6 captures an image of the nozzle 41 or the component P sucked by the nozzle 41 from below. Then, the arithmetic processing unit 110 can recognize the outer shape of the nozzle 41 and a sucked state of the component P by the nozzle 41 based on an image capturing result of the component recognition camera 6 obtained via the image capturing control unit 140.

Figure 3:
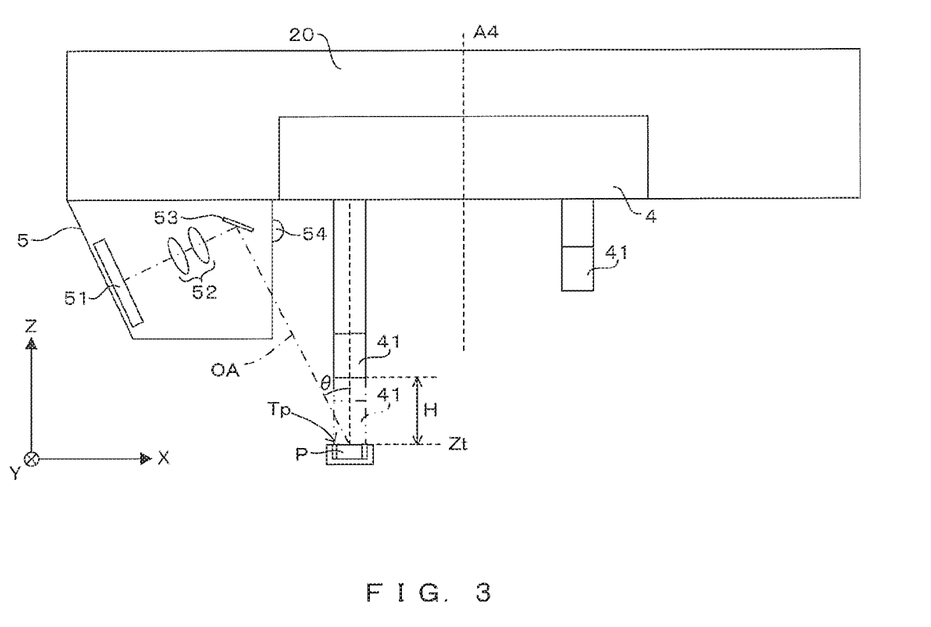
FIG. 3 is a view schematically showing an example of the configuration of the nozzle control camera.

FIG. 3 is a view schematically showing an example of the configuration of the nozzle control camera. Note that other members such as the head unit 20 are shown together with the nozzle control camera 5. Further, out of the plurality of nozzles 41, two nozzles 41 are shown as representatives, and both a state where the nozzle 41 is separated from the component P (solid line) and a state where the nozzle 41 is in contact with the component P (chain double-dashed line) are shown. The nozzle control camera 5 includes an image sensor 51, telecentric lenses 52 and a mirror 53. Light emitted from an image capturing object (component P, nozzle 41) and reflected by the mirror 53 is focused on the image sensor 51 by the telecentric lenses 52. Further, the nozzle control camera 5 includes an illuminator 54, and captures the image of the image capturing object by the image sensor 51 with the image capturing object illuminated by the illuminator 54. The image sensor 51 is an area sensor constituted by a solid-state image sensor such as a CMOS (Complementary MOS) image sensor or a CCD (Charge Coupled Device) image sensor, and the image I captured by the image sensor 51 is output to the image capturing control unit 140.

An optical axis OA of this nozzle control camera 5 is inclined by an angle of inclination θ (90°>θ>0°) with respect to the Z direction (vertical direction). In other words, the nozzle control camera 5 captures image of the image capturing object obliquely from above. This enables the nozzle control camera 5 to capture the image I including both of the component P and the nozzle 41 while the component P and nozzle 41 being lowered toward the component P are simultaneously within the field of view. Then, the image capturing control unit 140 adjusts a target height Zt, to which the nozzle 41 is lowered, based on a distance H between the nozzle 41 and the component P calculated from this image I.

Figure 4:
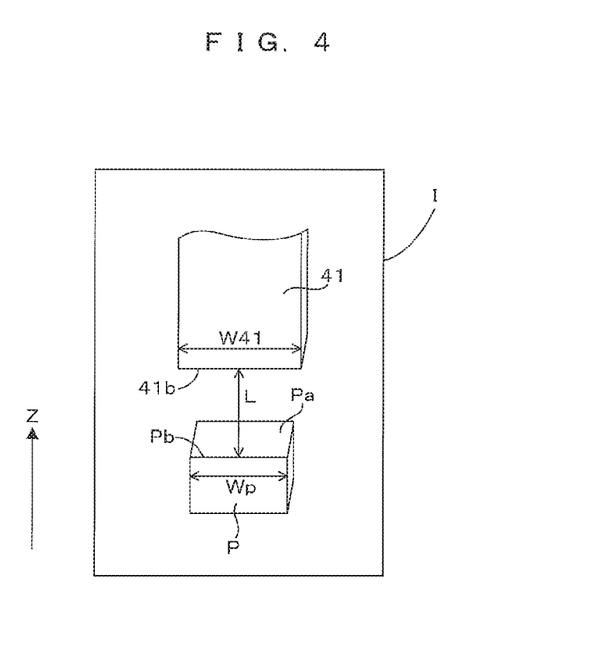
FIG. 4 is a view schematically showing an example of an image captured by the nozzle control camera.
Figure 5:
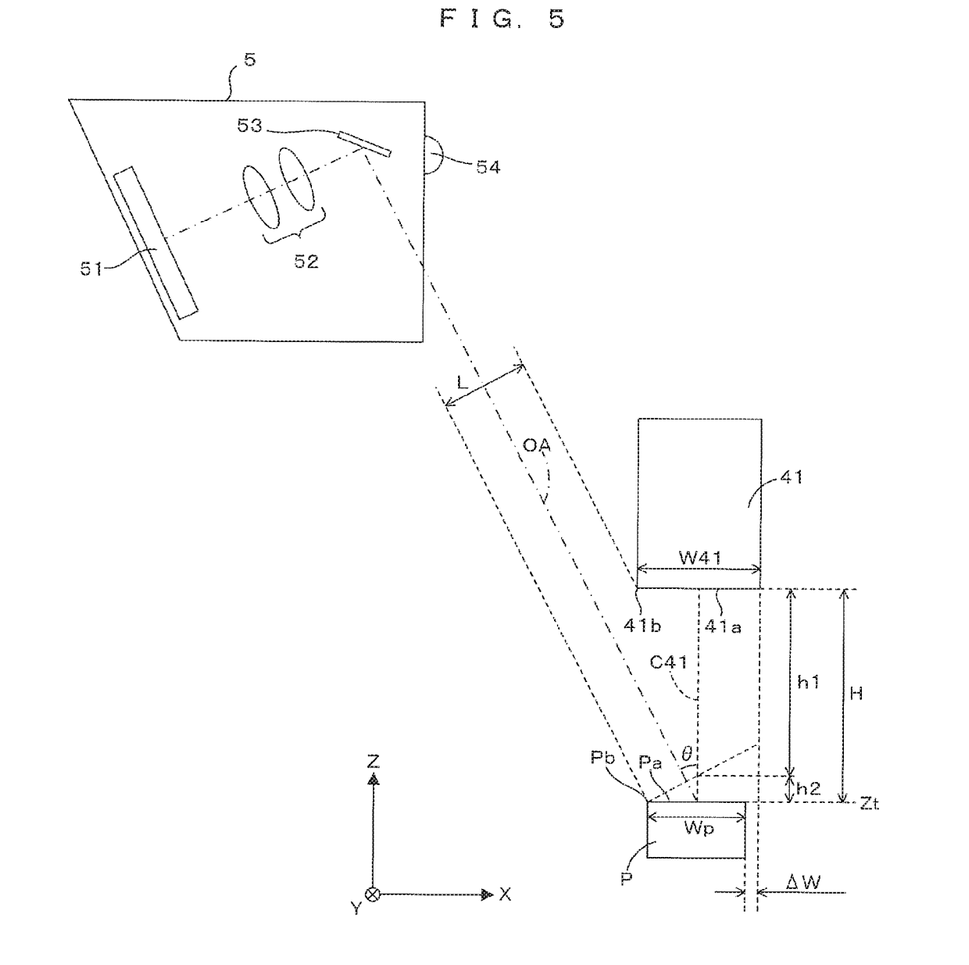
FIG. 5 is a view schematically showing an example of a method for calculating a distance between the nozzle and the component from the image captured by the nozzle control camera.

FIG. 4 is a view schematically showing an example of an image captured by the nozzle control camera, and FIG. 5 is a view schematically showing an example of a method for calculating a distance between the nozzle and the component from the image captured by the nozzle control camera. Note that a case where a center line C41 of the nozzle 41 coincides a center (geometric center of gravity) of an upper surface Pa of the component P is shown in FIGS. 4 and 5.

As shown in FIG. 4, the image I captured by the nozzle control camera 5 shows the distance L between an edge 41b on the side of the nozzle control camera 5 of a lower end surface 41a of the nozzle 41 and an edge Pb on the side of the nozzle control camera 5 of the upper surface Pa of the component P. The image capturing control unit 140 obtains the distance L based on a detection result of the respective edges 41b, Pb by an image processing such as edge detection.

In contrast, as is understood from FIG. 5, the distance H between the nozzle 41 and the component P in the Z direction is obtained from the following relational expressions:

$$h1 = L/\cos(90° - \theta) \quad \text{Equation 1}$$

$$h2 = \Delta W \times \tan(90° - \theta) \quad \text{Equation 2}$$

$$H = h1 + h2 \quad \text{Equation 3.}$$

Here, a dimensional difference ΔW is half the difference between a width W41 of the lower end surface 41a of the nozzle 41 in the X direction (depth direction of the nozzle control camera 5) and a width Wp of the upper surface Pa of the component P in the X direction. For example, the width W41 of the nozzle 41 is obtained from an imaging result of the lower end surface 41a of the nozzle 41 by the component recognition camera 6, and the width Wp of the component P is obtained from an imaging result of the upper surface Pa of the component P by the nozzle control camera 5. The arithmetic processing unit 110 adjusts the target height Zt, to which the nozzle 41 is lowered, to the upper surface Pa of the component P based on the distance H between the nozzle 41 and the component P in the Z direction calculated by Equations 1 to 3.

Figure 6:
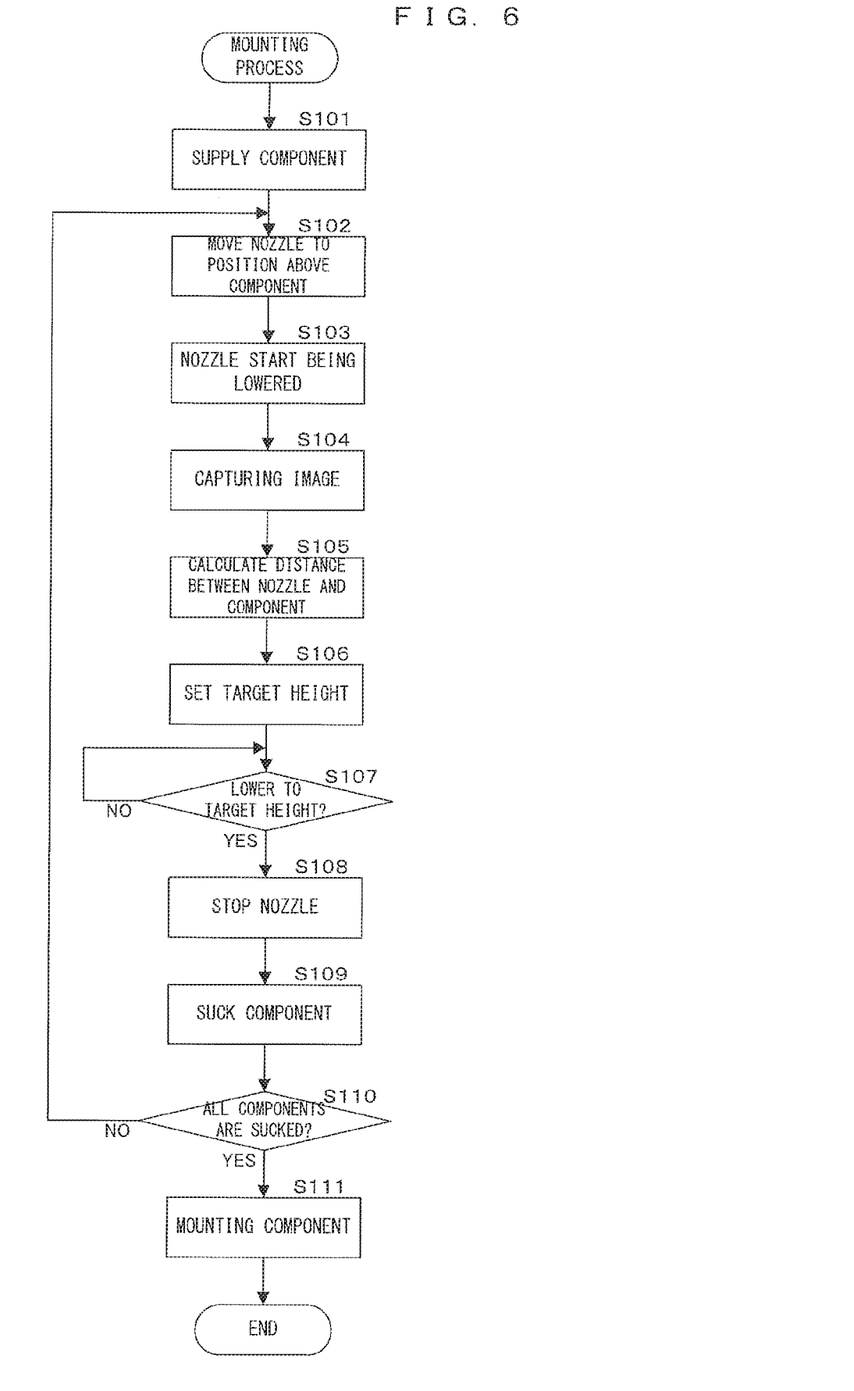
FIG. 6 is a flow chart according to a first embodiment of the disclosure.

FIG. 6 is a flow chart according to a first embodiment of the disclosure and specifically shows an example of a mounting process performed by the component mounting apparatus 1 of FIG. 1. This flow chart is performed by a control of the arithmetic processing unit 110. Incidentally, the mounting process shown in FIG. 6 is one process of mounting each component P on the board B by the mounting head 4 successively sucking the component P from the component supply unit 3 by means of the respective nozzle 41, and the component mounting apparatus 1 completes the mounting of the components on the board B by repeatedly performing the mounting process if necessary.

In the mounting process, the nozzle 41 is moved to a position above the component P supplied by the tape feeder 31 (Step S102) as the tape feeder 31 supplies the component P (Step S101). Note that, in Step S102, the nozzle 41 is caused to face a suction position of the upper surface Pa of the component P in the Z direction by adjusting a positional relationship of the nozzle 41 and the component P in the X direction and the Y direction by a method similar to that disclosed in JP 2015-90925A. Specifically, the arithmetic processing unit 110 obtains a center (suction position) of the upper surface Pa of the component P based on an imaging result of the component P by the nozzle control camera 5 and moves the nozzle 41 such that the center line C41 of the nozzle 41 coincides with this center. In this way, the suction position of the component P and the center line C41 of the nozzle 41 overlap in a plan view viewed from the Z direction.

Subsequently, the nozzle 41 starts being lowered toward the component P (Step S103). The nozzle 41 is lowered at a speed Va for a predetermined time from the start, and lowered at a speed Vb slower than the speed Va after the predetermined time elapses from the start. While the nozzle 41 is being lowered at the speed Va, the nozzle control camera 5 captures an image I including the nozzle 41 and the component P as illustrated in FIG. 4 (Step S104).

Further, the image capturing control unit 140 calculates the distance H between the nozzle 41 and the component P in the Z direction in accordance with the above Equations 1 to 3 (Step S105) and sets the target height Zt based on this distance H (Step S106). Specifically, The height that is lower by the lowered distance (=H−ΔH) obtained by subtracting a distance ΔH by which the nozzle 41 is lowered while Steps S104 to S106 are performed, from the distance H is set as the target height Zt.

When confirming that the lower end surface 41*a* of the nozzle 41 has been lowered to the target height Zt ("YES" in Step S107), the arithmetic processing unit 110 stops a lowering movement of the nozzle 41 (Step S108) and causes the nozzle 41 to suck the component P (Step S109). By stopping the lowering movement of the nozzle 41 at the target height Zt set based on the image I captured by imaging the nozzle 41 and the component P in this way, the nozzle 41 can be precisely brought into contact with the component P and a suction failure of the component P by the nozzle 41 can be suppressed. Steps S102 to S109 are repeated while the nozzles 41 are switched from one to another until the suction of all the components P to be sucked in this mounting process is completed ("NO" in Step S110). When the suction of all the components P is completed ("YES" in Step S110), the mounting head 4 moves to a position above the board B and the components P held by the respective nozzles 41 are mounted on the board B (Step S111).

In the first embodiment described above, the image I including both of the component P and the nozzle 41 that is being lowered toward the component P is captured (Step S104). The target height Zt at which the nozzle 41 is stopped in the mounting process is controlled based on this image I (Steps S105 to S107). This enables the target height Zt at the time of lowering the nozzle 41 toward the component P to be controlled regardless of a flow rate of air sucked from the nozzle 41.

Further, the controller 100 controls the target height Zt, at which the nozzle 41 being lowered is stopped, based on the image I captured by the nozzle control camera 5 while the nozzle 41 is being lowered toward the component P in the mounting process (Steps S103 to S107). In such a configuration, since the target height Zt of the nozzle 41 can be adjusted based on the image I including the component P planned to be sucked by the nozzle 41 that is being lowered, the target height Zt of the nozzle 41 can be properly controlled in relation to a thickness of the component P, for example, even if the thickness of the component P varies due to an individual difference.

Further, the controller 100 controls the target height Zt, at which the nozzle 41 is stopped in the mounting process, based on the edges 41*b*, Pb on the side of the nozzle control camera 5 of the lower end surface 41*a* of the nozzle 41 and the upper surface Pa of the component P included in the image I. In such a configuration, the target height Zt of the nozzle 41 can be properly controlled based on the edges 41*b*, Pb relatively easily distinguishable in the image processing.

Further, the nozzle control camera 5 is attached to the mounting head 4 via the head unit 20 and captures the image I in a direction oblique to the Z direction. The image I including both of the component P and the nozzle 41 that is being lowered toward the component P can be precisely captured by such a nozzle control camera 5.

Figure 7:
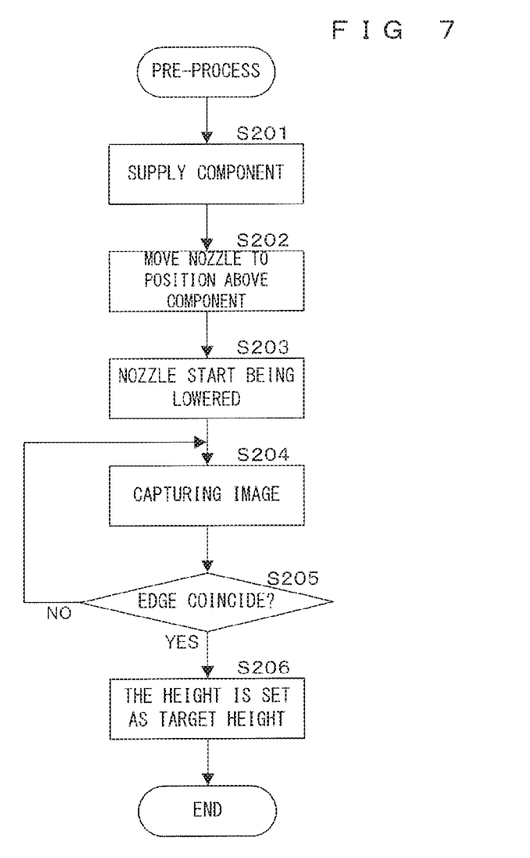
FIG. 7 is a flow chart according to a second embodiment of the disclosure.
Figure 8:
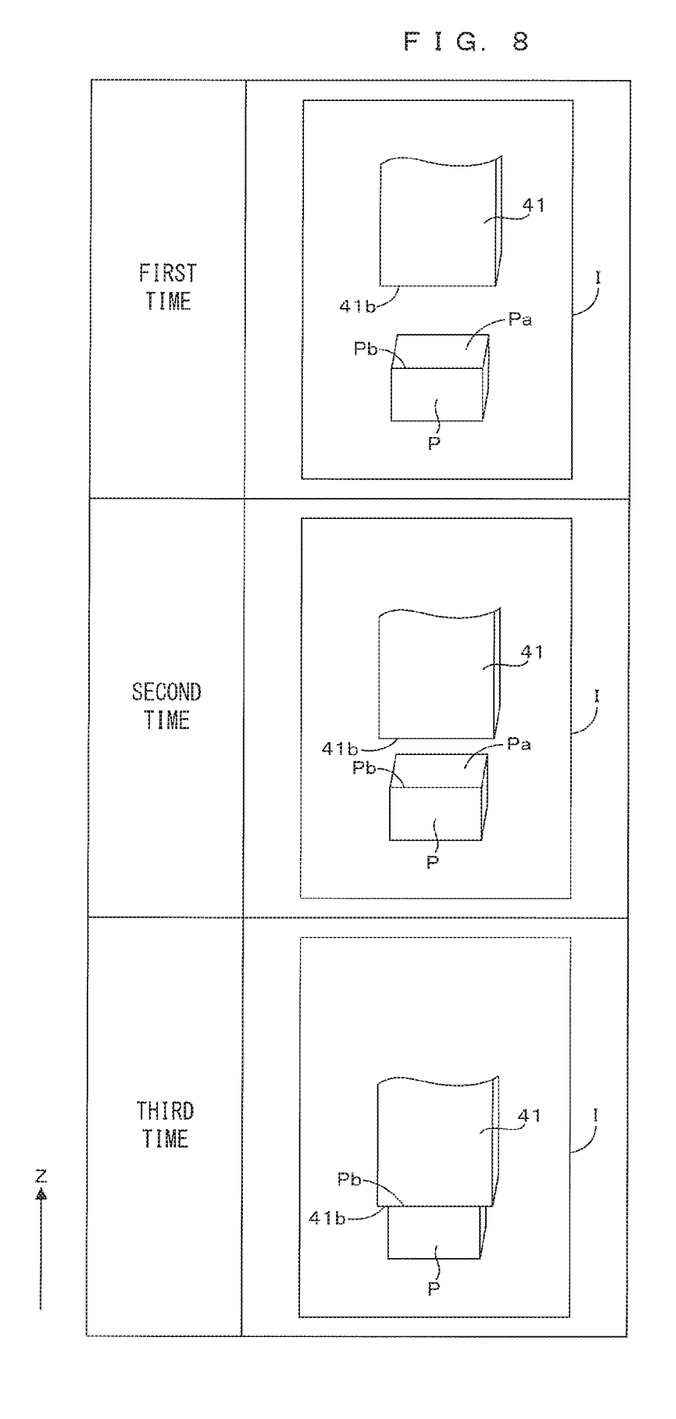
FIG. 8 is a diagram schematically showing examples of images captured in the pre-process of FIG. 7.

FIG. 7 is a flow chart according to a second embodiment of the disclosure and specifically shows an example of a pre-process performed before the mounting process by the component mounting apparatus 1 of FIG. 1. This flow chart is performed by a control of the arithmetic processing unit 110. FIG. 8 is a diagram schematically showing examples of images captured in the pre-process of FIG. 7.

In the pre-process, the nozzle 41 is moved to a position above the component P supplied by the tape feeder 31 (Step S202) as the tape feeder 31 supplies the component P (Step S201). Note that, in Step S202, the edge 41*b* of the nozzle 41 is caused to face the edge Pb of the component P from above by adjusting a positional relationship of the nozzle 41 and the component P in the X direction and the Y direction by the method similar to the one disclosed in JP 2015-90925A. Specifically, the arithmetic processing unit 110 obtains the edge Pb of the component P based on an imaging result of the component P by the nozzle control camera 5, and moves the nozzle 41 such that the edge 41*b* of the nozzle 41 faces the edge Pb of the component P from above. At this time, the position of the edge 41*b* of the nozzle 41 is calculated in advance based on an imaging result of the nozzle 41 by the component recognition camera 6. Note that each edge 41*b*, Pb can be obtained by an image processing such as edge detection. By performing Step S202, the edge Pb of the component P and the edge 41*b* of the nozzle 41 overlap in a plan view viewed from the Z direction.

Subsequently, this nozzle 41 starts being lowered toward the component P (Step S203). The nozzle control camera 5 captures an image I including both of the nozzle 41 and the component P (Step S204) while the nozzle 41 is being lowered. Image capturing in Step S204 is repeatedly performed until it is confirmed that the edge 41*b* of the nozzle 41 and the edge Pb of the component P have coincided (contacted) in the Z direction. In this way, images I shown in fields "First Time", "Second Time" and "Third Time" of FIG. 8 are captured. Note that these images I are displayed on the display/operation unit 150. When the image I in which the edge 41*b* of the nozzle 41 and the edge Pb of the component P are in contact as shown in the field "Third Time" of FIG. 8 ("YES" in Step S205) is obtained, the height of the lower end surface 41*a* of the nozzle 41 when this image I was captured is set as the target height Zt (Step S206).

Then, the component mounting apparatus 1 lowers the nozzle 41 to this target height Zt in the mounting process performed thereafter. If this is described using the flow chart of the mounting process of FIG. 6, Steps S101 to S103 are performed in the same manner as described above. On the other hand, Steps S104 to S106 are omitted and whether or not the nozzle 41 has been lowered to the target height Zt set in the pre-process of FIG. 8 is judged in Step S107. When it is confirmed that the nozzle 41 has been lowered to the target height Zt ("YES" in Step S107), Steps S108 to S111 are performed in the same manner as described above. As just described, also in the second embodiment, the nozzle 41 can be precisely brought into contact with the component P and a suction failure of the component P by the nozzle 41 can be suppressed by stopping a lowering movement of the nozzle 41 at the target height Zt set based on the image I captured by imaging the nozzle 41 and the component P.

As described above, in the second embodiment, the image I including both of the component P and the nozzle 41 that is being lowered toward the component P is captured (Step S204). Then, the target height Zt at which the nozzle is stopped in the mounting process is controlled based on this image I (Steps S206, S107). In this way, the target height Zt at the time of lowering the nozzle 41 toward the component P can be controlled regardless of a flow rate of air sucked from the nozzle 41.

Further, the controller 100 performs the pre-process of capturing the image I by the nozzle control camera 5 while lowering the nozzle 41 toward the component P and obtaining the height of the nozzle 41 when the contact of the nozzle 41 and the component P is confirmed based on the image I as the target height Zt. Then, the controller 100 stops the nozzle 41 being lowered in the mounting process at the target height Zt obtained in the pre-process. In such a configuration, the height of the nozzle 41 when the nozzle 41 and the component P are brought into contact is obtained as the target height Zt of the nozzle 41 in the pre-process performed before the mounting process. Thus, the lowering movement of the nozzle 41 can be stopped at the proper target height Zt in the subsequent mounting process.

Further, the controller 100 confirms the contact of the nozzle 41 and the component P based on the positions of the edges 41b, Pb on the side of the nozzle control camera 5 of the lower end surface 41a of the nozzle 41 and the upper surface Pa of the component P included in the image I. In such a configuration, the contact of the nozzle 41 and the component P can be precisely discriminated based on the edges 41b, Pb relatively easily distinguishable in the image processing.

Further, the controller 100 causes the nozzle control camera 5 to capture the image I a plurality of number of times while lowering the nozzle 41 toward the component P in the pre-process (Steps S203 to S205). When the image I (field "Third Time" of FIG. 8) in which the positions of the edges 41b, Pb on the side of the nozzle control camera 5 of the lower end of 41a of the nozzle 41 and the upper surface Pa of the component P satisfy a predetermined relationship is captured, the controller 100 judges the contact of the nozzle 41 and the component P. In such a configuration, whether or not the nozzle 41 has contacted the component P can be precisely discriminated based on a plurality of the images I.

Further, the component mounting apparatus 1 displays the image I captured in the pre-process on the display/operation unit 150. Thus, the operator can confirm, for example, a cause of a suction failure of the component P by the nozzle 41 by seeing the image I displayed on the display/operation unit 150.

As just described, in the above embodiments, the component mounting apparatus 1 corresponds to an example of a "component mounting apparatus" of the disclosure. The conveyors 12 correspond to an example of a "board holding unit" of the disclosure. The board B corresponds to an example of a "board" of the disclosure. The component supply unit 3 corresponds to an example of a "component supply unit" of the disclosure. The pocket Tp corresponds to an example of a "storage recess" of the disclosure. The component P corresponds to an example of a "component" of the disclosure. The upper surface Pa corresponds to an example of an "upper end part" of the disclosure. The edge Pb corresponds to an example of an "edge" of the disclosure. The mounting head 4 corresponds to an example of a "mounting head" of the disclosure. The nozzle 41 corresponds to an example of a "nozzle" of the disclosure. The lower end surface 41a corresponds to an example of a "lower end part" of the disclosure. The edge 41b corresponds to an example of the "edge" of the disclosure. The target height Zt corresponds to an example of a "target height" of the disclosure. Steps S101 to S111 correspond to an example of a "mounting process" of the disclosure. The nozzle control camera 5 corresponds to an example of an "image capturing unit" of the disclosure. The image I corresponds to an example of an "image" of the disclosure. The controller 100 corresponds to an example of a "control unit" of the disclosure. Steps S201 to S206 correspond to an example of a "pre-process" of the disclosure. The display/operation unit 150 corresponds to an example of a "display unit" of the disclosure. The Z direction corresponds to an example of a "vertical direction" of the disclosure.

Note that the disclosure is not limited to the above embodiments and various changes other than the aforementioned ones can be made without departing from the gist of the disclosure. For example, in Step S102 of the mounting process of FIG. 6, the center of the upper surface Pa of the component P is set as the suction position and the nozzle 41 is moved to the position above the suction position. However, the suction position of the component P is not limited to the center of the upper surface Pa of the component P and can be appropriately changed according to the shape, weight and the like of the component P. At this time, the distance H between the nozzle 41 and the component P in the Z direction may be calculated by appropriately deforming Equations 1 to 3 based on FIG. 5 according to a change of the suction position.

Further, in the mounting process of FIG. 6, the positional relationship of the nozzle 41 and the component P in the X and Y directions is adjusted (Step S103) before the lowering movement of the nozzle 41 is started. However, the positional relationship of the nozzle 41 and the component P in the X and Y directions may be adjusted while the nozzle 41 is lowered. At this time, the image I may be captured after the adjustment of such a positional relationship is completed.

Further, a timing of capturing the image I in Step S104 is not limited to the aforementioned example and may be appropriately changed. Thus, the image I may be captured after the lowering speed of the nozzle 41 is switched from the speed Va to the speed Vb.

Further, in the pre-process of FIG. 7, the edge 41b of the nozzle 41 is caused to face the edge Pb of the component P from above in Step S202. However, the positional relationship of the edge Pb of the component P and the edge 41b of the nozzle 41 in Step S202 is not limited to this and the edge 41b of the nozzle 41 may deviate from the edge Pb of the component P in a plan view viewed from the Z direction. In this case, the contact of the nozzle 41 and the component P may be judged in view of this deviation amount.

Further, in the mounting process of FIG. 6 and the pre-process of FIG. 7, the positional relationship of the nozzle 41 and the component P is judged based on the edges thereof. However, these criteria for judging the positional relationship are not limited to the edges.

Further, in Steps S104 to S107 of the first embodiment, the height of the nozzle 41 is controlled based on the image I including the component P and the nozzle 41. However, the height of the nozzle 41 may be controlled based on an image I including the pocket Tp and the nozzle 41. That is, the component P and the pocket Tp storing this have a predetermined positional relationship and it can be, for example, estimated that the upper surface Pa of the component P is present at a position lower than the upper end of the pocket Tp by a predetermined clearance. Thus, the image I including the pocket Tp and the nozzle 41 may be captured in Step S104 and the distance H between the nozzle 41 and the component P in the Z direction may be calculated from the positional relationship of the nozzle 41 and the pocket Tp in Step S105.

Further, in Steps S204 to S205 of the second embodiment, the contact of the nozzle 41 and the component P is judged based on the image I including the component P and the nozzle 41. However, the contact of the nozzle 41 and the component P may be judged based on the image I including the pocket Tp and the nozzle 41. That is, the image I including the pocket Tp and the nozzle 41 may be captured in Step S204 and the contact of the nozzle 41 and the component P may be judged based on the positional relationship of the nozzle 41 and the pocket Tp in Step S205.

Further, the above first and second embodiments do not exclude a control based on the flow rate of air sucked from the nozzle 41 and this control may be complementarily used.

Further, the configuration of the component supply unit 3 is not limited to the one for supplying the components P by the aforementioned tape feeder, and the components P may be supplied by a tray.

What is claimed is:

1. A component mounting apparatus, comprising:
   a board holder configured to hold a board;
   a component supplier configured to supply components stored in storage recesses;
   a mounting head configured to perform a mounting process of mounting the component on the board after stopping a nozzle being lowered toward the component at a target height and sucking the component by the nozzle in contact with the component at the target height;
   an imager configured to capture an image including both of the component or the storage recess and the nozzle being lowered toward the component; and
   a controller configured to control the target height, at which the nozzle is stopped in the mounting process, based on the image captured by the imager.

2. The component mounting apparatus according to claim 1, wherein the controller is configured to control the target height, at which the nozzle being lowered is stopped, based on the image captured by the imager while the nozzle is being lowered toward the component in the mounting process.

3. The component mounting apparatus according to claim 2, wherein the controller is configured to control the target height, at which the nozzle is stopped in the mounting process, based on edges on the imager side of a lower end part of the nozzle and an upper end part of the component included in the image.

4. The component mounting apparatus according to claim 1, wherein the controller is configured to perform a pre-process of causing the imager to capture the image while lowering the nozzle toward the component and obtaining a height of the nozzle when the contact of the nozzle and the component is confirmed based on the image as the target height, and stops the nozzle being lowered in the mounting process at the target height obtained in the pre-process.

5. The component mounting apparatus according to claim 4, wherein the controller is configured to confirm the contact of the nozzle and the component based on positions of edges on the imager side of a lower end part of the nozzle and an upper end part of the component included in the image.

6. The component mounting apparatus according to claim 5, wherein the controller is configured to cause the imager to capture the image a plurality of number of times while lowering the nozzle toward the component, and judges the contact of the nozzle and the component if the image in which the positions of the edges on the imager side of the lower end part of the nozzle and the upper end part of the component satisfy a predetermined relationship is captured in the pre-process.

7. The component mounting apparatus according to claim 4, further comprising a display configured to display the image captured in the pre-process.

8. The component mounting apparatus according to claim 1, wherein the imager is attached to the mounting head and captures the image in a direction oblique to a vertical direction.

9. The component mounting apparatus according to claim 5, further comprising a display configured to display the image captured in the pre-process.

10. The component mounting apparatus according to claim 6, further comprising a display configured to display the image captured in the pre-process.

11. The component mounting apparatus according to claim 2, wherein the imager is attached to the mounting head and captures the image in a direction oblique to a vertical direction.

12. The component mounting apparatus according to claim 3, wherein the imager is attached to the mounting head and captures the image in a direction oblique to a vertical direction.

13. The component mounting apparatus according to claim 4, wherein the imager is attached to the mounting head and captures the image in a direction oblique to a vertical direction.

14. The component mounting apparatus according to claim 5, wherein the imager is attached to the mounting head and captures the image in a direction oblique to a vertical direction.

15. The component mounting apparatus according to claim 6, wherein the imager is attached to the mounting head and captures the image in a direction oblique to a vertical direction.

16. The component mounting apparatus according to claim 7, wherein the imager is attached to the mounting head and captures the image in a direction oblique to a vertical direction.

17. The component mounting apparatus according to claim 9, wherein the imager is attached to the mounting head and captures the image in a direction oblique to a vertical direction.

18. The component mounting apparatus according to claim 10, wherein the imager is attached to the mounting head and captures the image in a direction oblique to a vertical direction.

19. A nozzle height control method, comprising:
   capturing an image including both of a component or a storage recess storing the component and a nozzle being lowered toward the component; and
   performing a mounting process of mounting the component on a board after stopping the nozzle lowered toward the component at a target height and sucking the component by the nozzle in contact with the component at the target height, such that the target height at which the nozzle is stopped in the mounting process, is controlled based on the image.

* * * * *